(12) United States Patent  
Sakai et al.

(10) Patent No.: US 8,901,011 B2  
(45) Date of Patent: Dec. 2, 2014

(54) SUBSTRATE PROCESSING APPARATUS AND SEMICONDUCTOR DEVICE PRODUCING METHOD

(75) Inventors: Masanori Sakai, Takaoka (JP); Tomohiro Yoshimura, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 801 days.

(21) Appl. No.: 13/104,626

(22) Filed: May 10, 2011

(65) Prior Publication Data

US 2011/0212626 A1 Sep. 1, 2011

Related U.S. Application Data

(62) Division of application No. 10/592,348, filed on Oct. 11, 2007, now Pat. No. 7,950,348.

(30) Foreign Application Priority Data

Mar. 12, 2004 (JP) .................................. 2004-070136

(51) Int. Cl.
```
H01L 21/469      (2006.01)
C23C 14/54       (2006.01)
C23C 16/455      (2006.01)
C23C 16/509      (2006.01)
H01L 21/67       (2006.01)
C23C 16/458      (2006.01)
C23C 16/34       (2006.01)
```

(52) U.S. Cl.
CPC ......... *C23C 16/45563* (2013.01); *C23C 16/509* (2013.01); *H01L 21/67253* (2013.01); *C23C 16/45525* (2013.01); *H01L 21/67109* (2013.01); *C23C 16/4584* (2013.01); *H01L 21/67017* (2013.01); *C23C 16/45546* (2013.01); *C23C 16/345* (2013.01)  
USPC .......................................... 438/758; 118/730

(58) Field of Classification Search  
CPC ............ C23C 16/455; C23C 16/45527; C23C 16/45546; H01L 21/00  
USPC .................................. 438/758; 118/758, 730  
See application file for complete search history.

(56) References Cited

U.S. PATENT DOCUMENTS

| | | | |
|---|---|---|---|
| 7,950,348 B2 * | 5/2011 | Sakai et al. ................... | 118/704 |
| 2001/0007244 A1 | 7/2001 | Matsuse | |
| 2003/0024477 A1 | 2/2003 | Okuda et al. | |

FOREIGN PATENT DOCUMENTS

| | | |
|---|---|---|
| JP | 2000-58527 A | 2/2000 |
| JP | 2003-502878 A | 1/2003 |
| JP | 2003-45864 A | 2/2003 |

* cited by examiner

*Primary Examiner* — Evan Pert  
(74) *Attorney, Agent, or Firm* — Birch, Stewart, Kolasch & Birch, LLP

(57) ABSTRACT

Disclosed is a substrate processing apparatus, including: a processing chamber for processing a substrate; a substrate rotating mechanism for rotating the substrate; a gas supply unit for supplying gas to the substrate, at least two kinds of gases A and B being alternately supplied a plurality of times to form a desired film on the substrate; and a controller for controlling a rotation period of the substrate or a gas supply period defined as a time period between an instant when the gas A is made to flow and an instant when the gas A is made to flow next time such that the rotation period and the gas supply period are not brought into synchronization with each other at least while the alternate gas supply is carried out predetermined times.

11 Claims, 7 Drawing Sheets

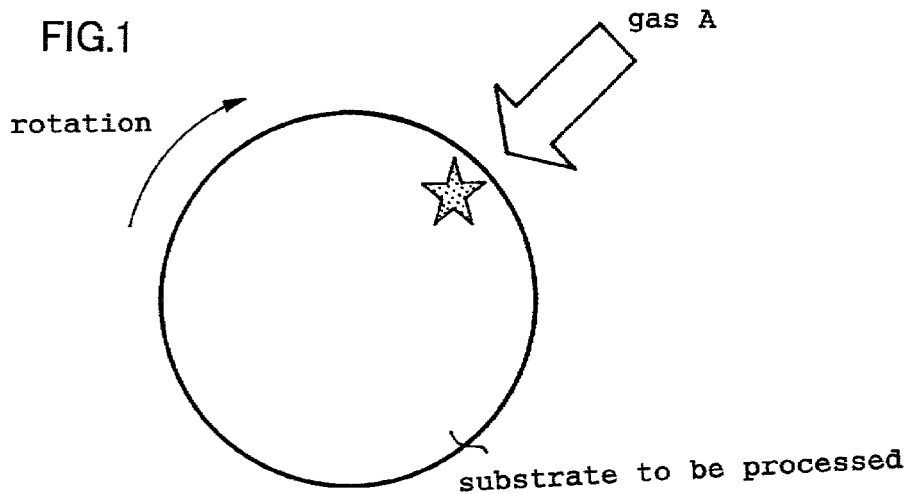
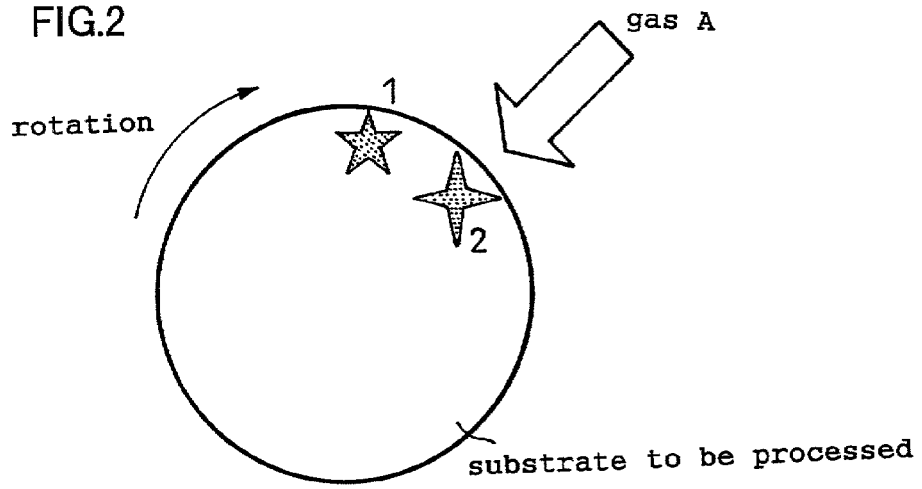

SUBSTRATE PROCESSING APPARATUS AND SEMICONDUCTOR DEVICE PRODUCING METHOD

This application is a Divisional of application Ser. No. 10/592,348, filed on Oct. 11, 2007 now U.S. Pat. No. 7,950,348, the entire contents of which are hereby incorporated by reference and for which priority is claimed under 35 U.S.C. §120.

TECHNICAL FIELD

The present invention relates to a substrate processing apparatus and a producing method of a semiconductor device, and more particularly, to a substrate processing apparatus and a producing method of a semiconductor device which process a semiconductor substrate using gas.

A general CVD apparatus forms a film on a substrate by keeping reaction gas flowing for a given time. At that time, the substrate is rotated in some cases to eliminate influence of a distance (short or long) from a gas supply port and to enhance the consistency of film thickness over the entire surface of the substrate. In such a case, generally, the film forming time is sufficiently long as compared with the rotation period, and the substrate is rotated many times when the film is formed because gas is supplied continuously. Therefore, it is unnecessary to take the rotation period into consideration strictly.

On the other hand, when gas is supplied periodically, it is necessary to take into consideration a relation between gas supply port and rotation period. For example, according to a film forming method called ALD (Atomic Layer Deposition), two kinds (or more kinds) raw material gases used for forming films are alternately supplied onto a substrate one kind by one kind under given film forming condition (temperature, time or the like), the gases are allowed to be adsorbed one atomic layer by one atomic layer, and a film is formed utilizing surface reaction. According to this ALD method, when two gases A and B alternately flow, the film forming process proceeds by repeating the following cycle: supply of gas A→purge (remove remaining gas)→supply of gas B→purge (remove remaining gas).

Assume that the time required for one cycle is defined as gas supply period T (seconds) and a rotation period of a substrate is defined as P (seconds). If the supplying cycle of gas and the rotation of a substrate are in synchronization with each other, i.e., if a numeric value of an integral multiple of T and a numeric value of an integral multiple of P match with each other, and if the matched numeric value is defined as L (seconds), gas is supplied to the same point of the substrate at time L (see FIG. 1), and a case in which the consistency cannot be enhanced occurs contrary to the purpose of eliminating the influence of distance from the gas supply port by means of rotation.

Hence, it is a main object of the present invention to provide a substrate processing apparatus capable of preventing or restraining the reaction gas supply period and the rotation period of a substrate from being brought into synchronization with each other, thereby preventing the consistency of thickness of a film formed on the substrate over its entire surface from being deteriorated. It is also an object of the invention to provide a producing method of a semiconductor device.

According to one aspect of the present invention, there is provided a substrate processing apparatus, comprising a processing chamber for processing a substrate; a substrate rotating mechanism for rotating the substrate; and a gas supply unit for supplying gas to the substrate, at least two kinds of gases A and B being alternately supplied a plurality of times to form a desired film on the substrate, a controller for controlling a rotation period of the substrate or a gas supply period defined as a time period between an instant when the gas A is made to flow and an instant when the gas A is made to flow next time such that the rotation period and the gas supply period are not brought into synchronization with each other at least while the alternate gas supply is carried out predetermined times.

According to another aspect of the present invention, there is provided a substrate processing apparatus, comprising a processing chamber for processing a substrate; a substrate rotating mechanism for rotating the substrate; a gas supply unit for supplying gas to the substrate, at least two kinds of gases A and B being alternately supplied a plurality of times to form a desired film on the substrate, and a controller for controlling a rotation period of the substrate or gas supply time such that the alternate supplying operation of the gases A and B is carried out predetermined times between the instant when the gas A is supplied to an arbitrary location of the substrate and the instant when the gas A is supplied to the arbitrary location of the substrate next time.

According to still another aspect of the resent invention, there is provided a substrate processing apparatus, comprising a processing chamber for processing a substrate; a substrate rotating mechanism for rotating the substrate; and a gas supply unit for supplying gas to the substrate, at least two kinds of gases A and B being alternately supplied a plurality of times to form a desired film on the substrate, and a controller for controlling a rotation period P of the substrate or a gas supply period T defined by a time period between the instant when the gas A is made to flow and the instant when the gas A is made to flow next time such that the gas supply period T and the rotation period P satisfy the following equation (1):

$$|mP - nT| > \neq 0 \ (n \text{ and } m \text{ are natural numbers}) \quad (1)$$

(wherein >≠0 means that truly greater than 0, and ∥ represents an absolute value).

According to still another aspect of the resent invention, there is provided a substrate processing apparatus, comprising a processing chamber for processing a substrate; a substrate rotating mechanism for rotating the substrate; a gas supply unit for supplying gas to the substrate; and a controller for controlling the rotating mechanism and the gas supply system such that a supply cycle of the reaction gas and a rotation period of the substrate do not come into synchronization with each other more than a given time when the reaction gas is supplied to the reaction chamber periodically.

According to still another aspect of the resent invention, there is provided a producing method of a semiconductor device, comprising with a substrate processing apparatus, comprising: a processing chamber for processing a substrate; a substrate rotating mechanism for rotating the substrate; and a gas supply unit for supplying gas to the substrate, at least two kinds of gases A and B being alternately supplied a plurality of times to form a desired film on the substrate, wherein the substrate processing apparatus further comprises a controller for controlling a rotation period of the substrate or a gas supply period defined as a time period between an instant when the gas A is made to flow and an instant when the gas A is made to flow next time such that the rotation period and the gas supply period are not brought into synchronization with each other at least while the alternate gas supply is carried out predetermined times, processing the substrate.

According to still another aspect of the resent invention, there is provided a producing method of a semiconductor device, comprising with a substrate processing apparatus, comprising a processing chamber for processing a substrate; a substrate rotating mechanism for rotating the substrate; and a gas supply unit for supplying gas to the substrate, at least two kinds of gases A and B being alternately supplied a plurality of times to form a desired film on the substrate, wherein the substrate processing apparatus further comprises a controller for controlling a rotation period of the substrate or gas supply time such that the alternate supplying operation of the gases A and B is carried out predetermined times between the instant when the gas A is supplied to an arbitrary location of the substrate and the instant when the gas A is supplied to the arbitrary location of the substrate next time, processing the substrate.

According to still another aspect of the resent invention, there is provided a producing method of a semiconductor device, comprising with a substrate processing apparatus, comprising a processing chamber for processing a substrate; a substrate rotating mechanism for rotating the substrate; and a gas supply unit for supplying gas to the substrate, at least two kinds of gases A and B being alternately supplied a plurality of times to form a desired film on the substrate, wherein the substrate processing apparatus further comprises a controller for controlling a rotation period P of the substrate or a gas supply period T defined by a time period between the instant when the gas A is made to flow and the instant when the gas A is made to flow next time such that the gas supply period T and the rotation period P satisfy the following equation (1):

$$|mP-nT| > \neq 0 \text{ ($n$ and $m$ are natural numbers)} \quad (1)$$

(wherein $>\neq 0$ means that truly greater than 0, and $\|$ represents an absolute value), processing the substrate.

BRIEF DESCRIPTION OF THE FIGURES IN THE DRAWINGS

FIG. 1 is a diagram used for explaining a gas supply state when a rotation period of a substrate to be processed and a gas supply period come into synchronization with each other.

FIG. 2 is a diagram used for explaining a gas supply state when a rotation period of a substrate to be processed and a gas supply period do not come into synchronization with each other.

PREFERABLE MODE FOR CARRYING OUT THE INVENTION

In a preferred embodiment of the invention, the rotation period P and the gas supply period T are finely adjusted to satisfy the following equation (1):

$$|mP-nT| > \neq 0 \text{ ($n$ and $m$ are natural numbers)} \quad (1)$$

(wherein $>\neq 0$ means that greater than 0, and $\|$ represents an absolute value).

If the equation (1) is satisfied, it is possible to prevent the supply start timing of gas A during the gas supply period from coming into synchronization with a rotation position of the substrate (see FIG. 2), and the consistency can be improved.

If the time span during which the equation (1) is satisfied is taken into consideration, it is of course sufficient if the equation (1) is satisfied for the entire film forming time, but the condition may be weakened a little, and it is conceived that there is no problem in terms of consistency if the synchronization is not established for a time span corresponding to 10 cycles (10T (seconds) if the above symbol is used), for example, because the gas injection timing is sufficiently dispersed.

Embodiment 1

The following description is based on an example in which DCS($SiH_2Cl_2$, dichlor-silane) and $NH_3$ (ammonia) are alternately supplied twice or more, and an SiN (silicon nitride) film is formed on a silicon wafer by the ALD method.

When a rotation period P of a wafer is 6.6666 seconds and a gas supply period T is 20 seconds, since 3×6.6666=20, time 20 seconds required for three rotations becomes equal to the gas supply period T. Therefore, if the wafer is rotated three times, the rotation period of the wafer and the relative position of a gas supply nozzle become the same, the gas is adversely supplied to the same location again, and a thickness of the film at its portion located upstream of the gas flow is increased. FIG. 3B shows a film thickness distribution at that time. A left portion of the film is thick, and a portion of the film from its right side toward the right lower portion becomes thin. It can be found that when a wafer is rotated, the distribution becomes concentric and the consistency is enhanced, but if the rotation period of the wafer and the gas supply period come into synchronization with each other, such effect cannot be obtained. If the wafer is not rotated, the thickness consistency over the entire surface of the wafer is 12% (see FIG. 3A), and the thickness consistency over the entire surface of the wafer when the synchronization is established is about 7% (see FIG. 3B).

Figure 3A:
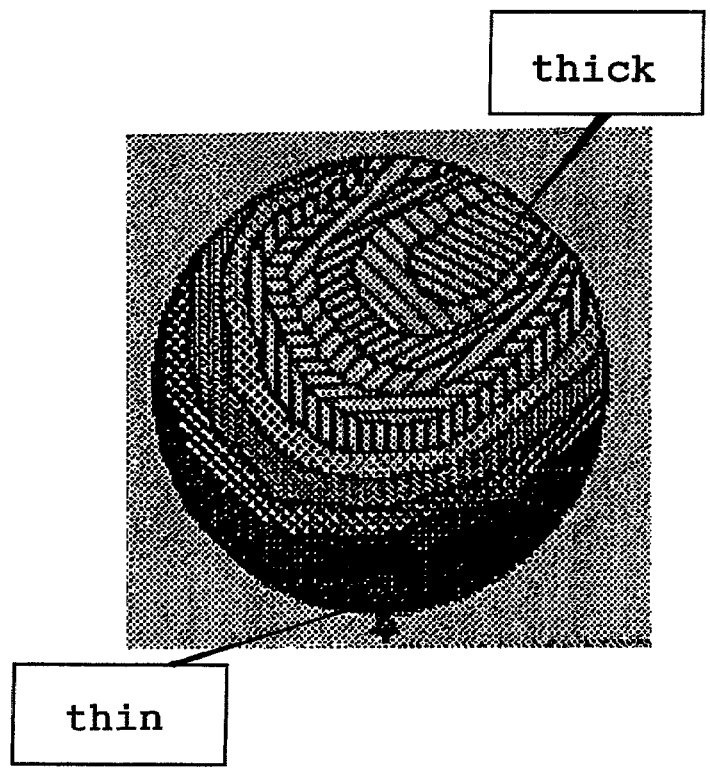
FIG. 3A shows a film thickness distribution when the substrate to be processed is not rotated.
Figure 3B:
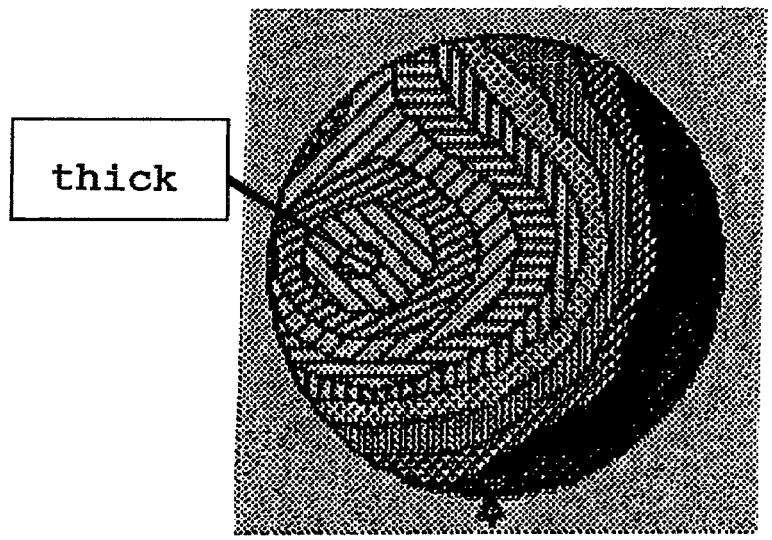
FIG. 3B shows a film thickness distribution when the substrate to be processed is rotated and the rotation period of the substrate to be processed and gas supply period come into synchronization with each other.

The thicknesses in FIGS. 3A and 3B are different from each other. This is because that since the wafer in FIG. 3B is rotated, when the thick portion becomes close to a nozzle of DCS, DCS is supplied.

Figure 3C:
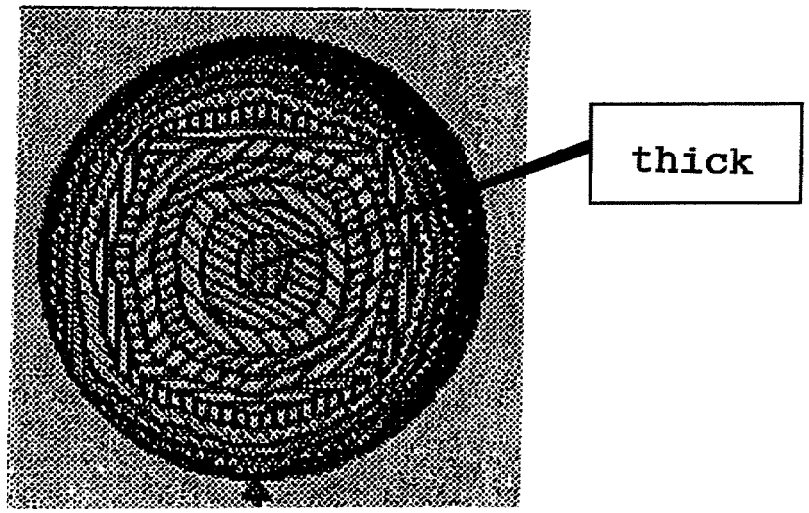
FIG. 3C shows a film thickness distribution when the substrate to be processed is rotated and the rotation period of the substrate to be processed and gas supply period does not come into synchronization with each other.

On the other hand, when the rotation period P of the wafer is 6.6666 seconds and the gas supply period T is 21 seconds, the DCS injecting timing does not come into synchronization with the first injection until 1,260 seconds are elapsed. As many as 60 cycles have been carried out so far, the injection of the DCS is sufficiently dispersed, and concentric film thickness distribution having no deviation is obtained as shown in FIG. 3C. When the rotation period of a wafer and the gas supply period are not in synchronization with each other until so many cycles are carried out, the consistency of film thickness of the wafer over the entire surface thereof is improved to 3.7% (see FIG. 3C).

Figure 4:
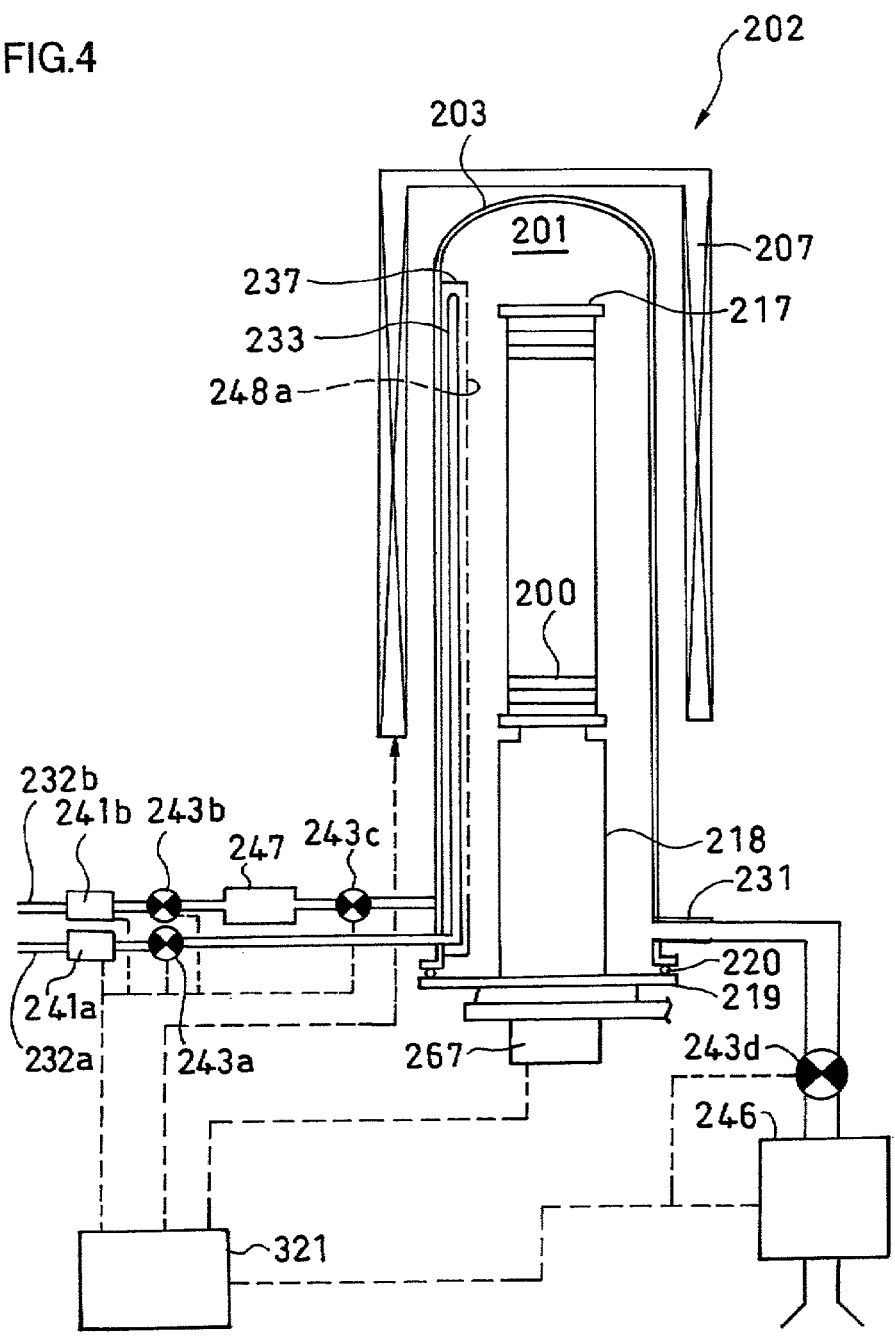
FIG. 4 is a schematic longitudinal sectional view for explaining a vertical substrate processing furnace of a substrate processing apparatus according to one embodiment of the present invention.
Figure 5:
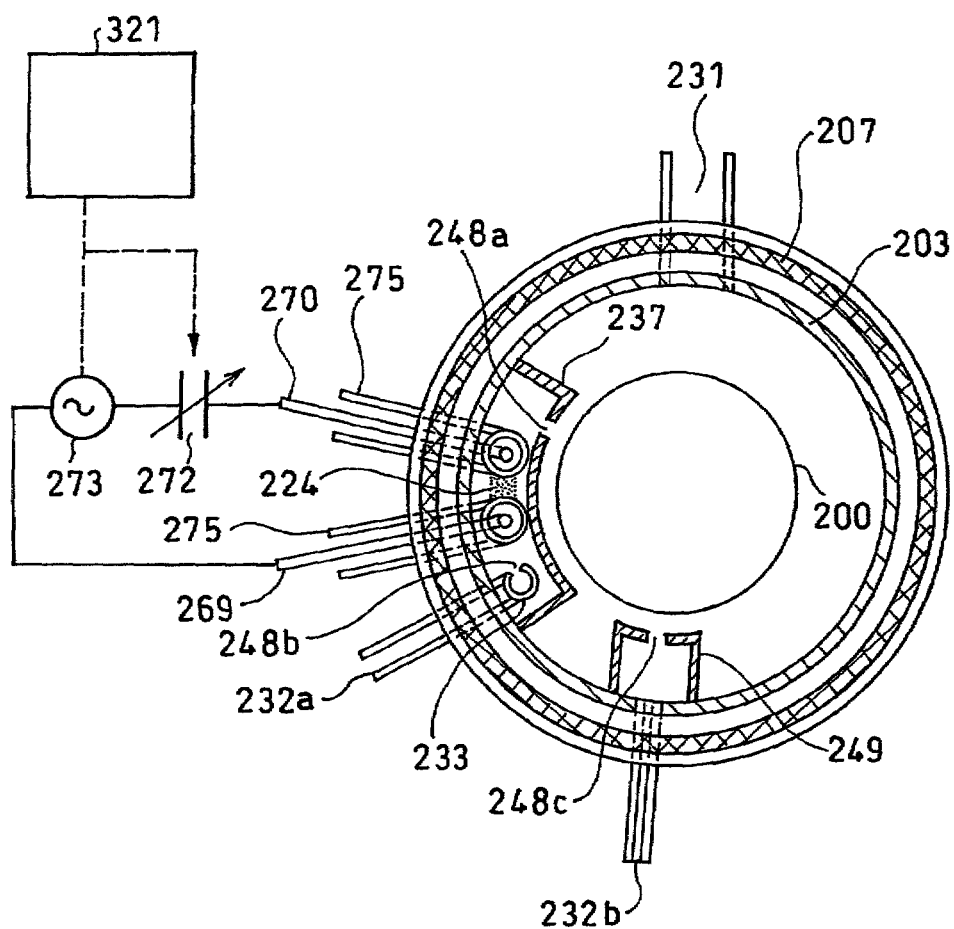
FIG. 5 is a schematic transversal sectional view for explaining the vertical substrate processing furnace of the substrate processing apparatus according to the one embodiment of the present invention.

FIG. 4 schematically shows showing a structure of a vertical type substrate processing furnace according to this embodiment, and is a vertical sectional view of a processing furnace portion. FIG. 5 schematically shows showing a structure of the vertical type substrate processing furnace according to this embodiment, and is a transverse sectional view of the processing furnace portion. A reaction tube 203 as a reaction container for processing wafers 200 which are substrates is provided in a heater 207 which is heating means. A lower end opening of the reaction tube 203 is air-tightly closed with a seal cap 219 which is a lid through an O-ring 220 which is a hermetic member. At least the heater 207, the reaction tube 203 and the seal cap 219 form a processing furnace 202. The reaction tube 203 and the seal cap 219 form a reaction chamber 201. A boat 217, which is a substrate holding means, stands from the seal cap 219 through a quartz cap 218. The quartz cap 218 is a holding member which holds the boat. The boat 217 is inserted into the processing furnace 202. A plurality of wafers 200 to be batch-processed are multi-stacked in an axial direction of the tube in their horizontal attitude. The heater 207 heats the wafers 200 inserted into the processing furnace 202 to a predetermined temperature.

The processing furnace 202 is provided with two gas supply tube 232a and 232b as supply tubes for supplying a plurality of kinds (here, two kinds) of gases. From the first gas supply tube 232a, reaction gas is supplied into the processing furnace 202 through a first mass flow controller 241a which is flow rate control means, a first valve 243a which is an open/close valve and a buffer chamber 237 formed in the later-described processing furnace 202. From the second gas supply tube 232b, reaction gas is supplied to the processing furnace 202 through a second mass flow controller 241b which is flow rate control means, a second valve 243b which is an open/close valve, a gas reservoir 247, a third valve 243c which is an open/close valve, and a later-described gas supply unit 249.

The processing furnace 202 is connected to a vacuum pump 246 which is an exhaust means through a fourth valve 243d by means of a gas exhaust tube 231 which is an exhaust tube for exhausting gas, and the processing furnace 202 is evacuated. The fourth valve 243d is an open/close valve. By opening or closing the fourth valve 243d, the processing furnace 202 can be evacuated or the evacuation can be stopped. The opening degree of the fourth valve 243d can be adjusted using pressure.

A buffer chamber 237 is provided in an arc space between the wafers 200 and an inner wall of the reaction tube 203 constituting the processing furnace 202. The buffer chamber 237 is a gas dispersing space extending in a stacking direction of the wafers 200. The buffer chamber 237 extends along the inner wall from a lower portion to an upper portion of the reaction tube 203. An end of a wall of the buffer chamber 237 adjacent to the wafers 200 is provided with first gas supply holes 248a for supplying gas. The first gas supply holes 248a are opened toward a center of the reaction tube 203. The first gas supply holes 248a have the same opening areas from the lower portion to the upper portion, and the holes are provided at the same pitch.

A nozzle 233 is disposed at an end of the buffer chamber 237 opposite from the end at which the first gas supply holes 248a are provided. The nozzle 233 is disposed along the stacking direction of the wafers 200 from the lower portion to the upper portion of the reaction tube 203. The nozzle 233 is provided with second gas supply holes 248b for supplying a plurality of gases. When a pressure difference between the buffer chamber 237 and the processing furnace 202 is small, the opening areas of the second gas supply holes 248b may be the same and the opening pitches may be the same from its upstream side toward its downstream side, but if the pressure difference is great, the opening areas may be increased or the opening pitches may be reduced from the upstream side toward the downstream side.

In this invention, if the opening areas or the opening pitches of the second gas supply holes 248b are adjusted from the upstream side to the downstream side, gases can be injected substantially at the same flow rate although flowing speeds of gases are different from one another among the gas supply holes 248b. Gas injected from each second gas supply hole 248b is injected to the buffer chamber 237 and is once introduced, and the flowing speeds of gases are equalized.

That is, in the buffer chamber 237, gas particle velocity of gas injected from each second gas supply hole 248b is moderated, and then the gas is injected into the processing furnace 202 from the first gas supply holes 248a. During this time, gases injected from each of the second gas supply holes 248b had equal flow rates and flowing speeds when the gases were injected from the first gas supply holes 248a.

A first rod-like electrode 269 which is a first electrode having a thin and long structure, and a second rod-like electrode 270 which is a second electrode, are disposed in the buffer chamber 237 such as to extend from an upper portion to a lower portion in the buffer chamber 237. The first rod-like electrode 269 and the second rod-like electrode 270 are protected by electrode protection tubes 275 which are protection tubes for protecting the electrodes. One of the first rod-like electrode 269 and the second rod-like electrode 270 is connected to a high frequency power supply 273 through a matching device 272, and the other one is grounded (reference potential). As a result, plasma is produced in a plasma producing region 224 between the first rod-like electrode 269 and the second rod-like electrode 270.

The electrode protection tubes 275 can be inserted in the buffer chamber 237 in a state where the first rod-like electrode 269 and the second rod-like electrode 270 are isolated from atmosphere in the buffer chamber 237. If the atmosphere in the electrode protection tube 275 is the same as outside air (atmosphere), the first rod-like electrode 269 and the second rod-like electrode 270 respectively inserted into the electrode protection tubes 275 are oxidized by heat from the heater 207. Thus, there is provided an inert gas purge mechanism which charges or purges inert gas such as nitrogen into and from the electrode protection tube 275, reduces the oxygen concentration to a sufficiently low value, and prevents the first rod-like electrode 269 or the second rod-like electrode 270 from being oxidized.

A gas supply unit 249 is provided on an inner wall of the reaction tube 203 at a location away from the first gas supply holes 248a through 120°. When a plurality of kinds of gases are supplied to the wafers 200 alternately one kind by one kind by the ALD method to form films, the gas supply unit 249 and the buffer chamber 237 alternately supply the gases to the wafers 200.

Like the buffer chamber 237, the gas supply unit 249 also includes third gas supply holes 248c for supplying gas at the same pitch to a position adjacent to the wafer. The second gas supply tube 232b is connected to the gas supply unit 249.

When the pressure difference between the buffer chamber 237 and the processing furnace 202 is small, it is preferable that the opening areas of the third gas supply holes 248c are equal to each other from the upstream side to the downstream side and the holes are arranged at the same opening pitch, but when the pressure difference is great, it is preferable that the opening areas are increased or the opening pitch is reduced from the upstream side to the downstream side.

The boat 217 is provided at the central portion in the reaction tube 203. The plurality of wafers 200 are placed on the boat 217 at the multi-stacked manner at equal distances from one another. The boat 217 is brought into and out from the reaction tube 203 by a boat elevator mechanism (not shown). To enhance the consistency of processing, a boat rotating mechanism 267, which is a rotating means for rotating the boat 217, is provided. If the boat rotating mechanism 267 is rotated, the boat 217 held by the quartz cap 218 is rotated.

A controller 121 is a control means. The controller 121 is connected to the first and second mass flow controllers 241a and 241b, first to fourth valves 243a, 243b, 243c and 243d, the heater 207, the vacuum pump 246, the boat rotating mechanism 267, a boat vertically moving mechanism (not shown), the high frequency power supply 273 and the matching device 272. The controller 121 adjusts the flow rates of the first and second mass flow controllers 241a and 241b, opens and closes first to third valves 243a, 243b and 243c, opens and closes the fourth valve 243d and adjusts the pressure of the fourth valve 243d, adjusts the temperature of the heater 207, starts and stops the vacuum pump 246, adjusts the rotation speed of the boat rotating mechanism 267, controls the vertical motion of the boat vertically moving mechanism, controls the electricity supply to the high frequency power supply 273, and controls impedance by the matching device 272.

Next, an example of forming a nitride film (SiN film) using DCS ($SiH_2Cl_2$, dichlor-silane) and $NH_3$ gas by the ALD method will be explained.

First, wafers 200 on which films are to be formed are placed on the boat 217, and the boat 217 is brought into the processing furnace 202. Then, the following three steps are carried out.

Although DCS is first allowed to flow into the furnace in the following example, a method in which $NH_3$ is allowed to flow first is also substantially the same.

(1) A desired amount of DCS is previously stored in a state where 243b is opened and 243c is closed (it is preferable that raw material is stored in the gas reservoir 247 previously at the first cycle, and after the second cycle, the raw material is stored in the gas reservoir 247 at any time except at event in which the raw material from the gas reservoir 247 is discharged so as not to waste the time).

(2) Before DCS stored in the gas reservoir 247 is discharged, it is preferable to previously flow inert gas such as $N_2$ from the buffer chamber 237. This avoids an adverse case in which DCS stored in the gas reservoir 247 flows into the reaction tube 203 in a rush due to the pressure difference between the gas reservoir 247 and the reaction tube 203 in the next event, and the DCS back flows into the buffer chamber 237 from the gas supply port 248a of the buffer chamber 237.

(3) By opening the valve 243c located downstream from the gas reservoir 247, DCS stored in the gas reservoir 247 is supplied to the wafers 200 which are substrates to be processed, from the gas supply ports 248c formed in the buffer chamber (gas supply unit) 249, each provided between the substrates through the buffer chamber (gas supply unit) 249. The pressure of the adjusting means (valve 243d such as a butterfly valve provided in an intermediate portion of an exhaust tube) of pressure in the furnace is set high so that the partial pressure of DCS becomes high so as to facilitate the adsorption of raw material. In this case also, it is preferable to keep flowing inert gas such as $N_2$ from the buffer chamber 237. The wafer temperature at that time is 300 to 600° C.

(4) The valve 243c is closed and the supply of DCS to the gas reservoir 247 is stopped. After the valve 243c is closed, the time elapsed until the next supply starts can be used for storing DCS (that is, since DCS gas can be stored in the gas reservoir 247 while another event is being carried out, it is unnecessary to prepare extra time for an event of only storing).

(5) Next, DCS is removed from the reaction tube 203 and the buffer chamber (gas supply unit) 249 by the vacuum exhaust means 243. At that time, it is effective for replacing gas by adding an inert gas line between the valve 243c and the buffer chamber (gas supply unit) 249, and combining a push-out operation by means of inert gas and an evacuation operation.

(6) Next, $NH_3$ is supplied into the buffer chamber 237 from the gas supply tube 232a through the nozzle 233 connected to the buffer chamber 237. At that time also, it is preferable to flow inert gas from the buffer chamber (gas supply unit) 249 for the same reason as that described above.

(7) The $NH_3$ is supplied to the buffer chamber 237 from the nozzle 233 such that the pressure in the buffer chamber 237 becomes uniform. The $NH_3$ is supplied to the wafers 200 as the substrates to be processed from the gas supply holes 248b formed in the buffer chamber 237 such that each gas supply hole is located between the adjacent substrates. If this embodiment is used, it is possible to supply $NH_3$ to the plurality of wafers 200 as the substrates to be processed in the same manner.

The temperature of the heater 207 at that time is set such that the wafers 200 are heated to 300 to 600° C. Since the $NH_3$ has high reaction temperature, the $NH_3$ does not react at the wafer temperature. Therefore, the $NH_3$ is plasma-excited and allowed to flow as active species. Therefore, the reaction can be carried out in the set low wafer temperature range.

(8) The supply of $NH_3$ into the reaction tube 203 is stopped.

(9) Next, the removing operation of the $NH_3$ from the reaction tube 203 and the buffer chamber 237 is carried out by an exhausting operation carried out using the vacuum exhausting means 243. In this case also, it is effective to combine a push-out operation by means of inert gas and an evacuation operation.

The operations (1) to (9) correspond to one cycle, and by repeating the operations (1) to (9), the film forming process proceeds.

In an ALD apparatus, gas is adsorbed on a backing film surface. An adsorption amount of gas is proportional to the pressure of gas and exposed time of gas. Therefore, in order to allow a desired given amount of gas to be adsorbed in a short time, it is necessary to increase the gas pressure in a short time. In this aspect, in the embodiment, the valve 243d is closed and DCS stored in the gas reservoir 247 is supplied instantaneously. Therefore, the pressure of DCS in the reaction tube 203 can be increased abruptly, and a desired given amount of gas can be adsorbed instantaneously.

In this embodiment, while DCS is stored in the gas reservoir 247, $NH_3$ is plasma-excited and is supplied as the active species and gas is exhausted from the processing furnace 202. These operations are necessary steps in the ALD method. Therefore, a special step for storing DCS is not required. Gas is exhausted from the processing furnace 202, $NH_3$ gas is removed and then DCS is allowed to flow. Therefore, $NH_3$ gas and DCS do not react with each other on the way to the wafers 200. The supplied DCS can effectively react only with $NH_3$ which are adsorbed on the wafer 200.

Figure 6:
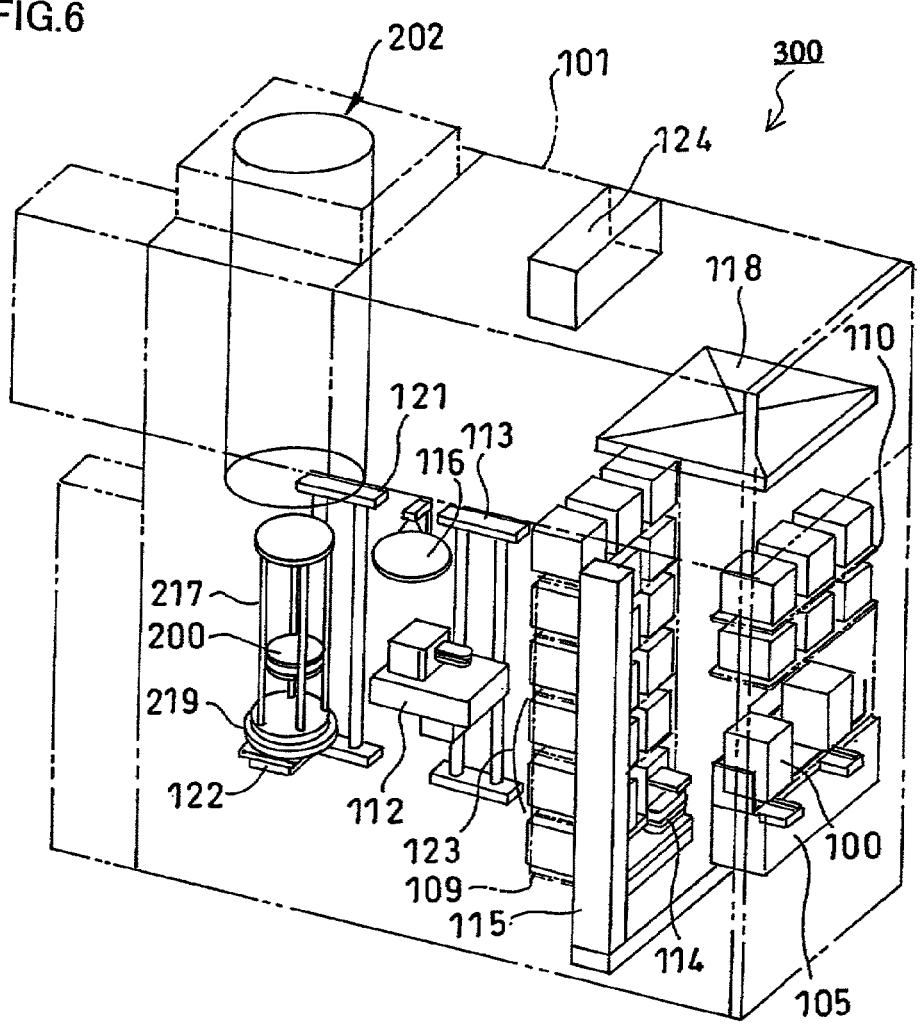
FIG. 6 is a schematic perspective view for explaining the substrate processing apparatus body according to the one embodiment of the present invention.

Next, referring to FIG. 6, an outline of the semiconductor producing apparatus, which is one example of the semiconductor producing apparatus to which the present invention is applied, will be explained.

A cassette stage 105, which functions as a holding tool delivery member which delivers a cassette 100 (a substrate accommodating container) between a casing 101 and an external transfer apparatus (not shown), is provided on a front surface side in the casing 101. A cassette elevator 115 which functions as an elevator means is provided on a rear side of the cassette stage 105. A cassette loader 114 which functions as a transfer means is mounted on the cassette elevator 115. A cassette shelf 109 which functions as a placing means of the cassette 100 is provided on the rear side of the cassette elevator 115, and an auxiliary cassette shelf 110 is provided also above the cassette stage 105. A clean unit 118 is provided above the auxiliary cassette shelf 110 so that clean air can flow into the casing 101.

The processing furnace 202 is provided above a rear portion of the casing 101. A boat elevator 121 which functions as an elevator means is provided below the processing furnace 202. The boat elevator 121 vertically moves the boat 217, which functions as the substrate holding means, to and from the processing furnace 202. The boat 217 holds the wafers 200 as substrates in the multi-stacked manner in their horizontal attitudes. The seal cap 219 is mounted as a lid on a tip end of a vertically moving member 122 which is mounted on the boat elevator 121, and the seal cap 219 vertically supports the boat 217. A loading elevator 113 is provided as an elevator means between the boat elevator 121 and the cassette shelf 109. A wafer loader 112 which functions as a transfer means is mounted on the loading elevator 113. A furnace opening shutter 116 which functions as a shielding member is provided by the side of the boat elevator 121. The furnace opening shutter 116 has an opening/closing mechanism and closes a lower surface of the processing furnace 202.

In the cassette 100, the wafers 200 are rotated through 90° by the cassette stage 105 such that wafers 200 are brought into the cassette stage 105 from an external transfer apparatus (not shown) and the wafers 200 assume the horizontal attitudes. The cassette 100 is transferred to the cassette shelf 109 or the auxiliary cassette shelf 110 from the cassette stage 105 by cooperation of vertical movement and lateral movement of the cassette elevator 115 and forward and backward movement and rotational movement of the cassette loader 114.

The cassette shelf 109 includes a transfer shelf 123 in which cassette 100 to be transferred by the wafer loader 112 is accommodated. The cassette 100 on which the wafers 200 are set is transferred to the transfer shelf 123 by the cassette elevator 115 and the cassette loader 114.

If the cassette 100 is transferred to the transfer shelf 123, the wafers 200 are loaded on the boat 217, which is lowered from the transfer shelf 123 by cooperation of forward and backward motion and rotational motion of the wafer loader 112 and vertical motion of the loading elevator 113.

If a necessary number of wafers 200 are loaded on the boat 217, the boat 217 is inserted into the processing furnace 202 by the boat elevator 121, and the processing furnace 202 is air-tightly closed with the seal cap 219. In the air-tightly closed processing furnace 202, the wafers 200 are heated, processing gas is supplied into the processing furnace 202, and the wafers 200 are processed.

If the processing of the wafers 200 is completed, the wafers 200 are moved to the cassette 100 of the transfer shelf 123 from the boat 217 following the above procedure in reverse, the cassette 100 is moved to the cassette stage 105 from the transfer shelf 123 by the cassette loader 114, and is transferred out from the casing 101 by the external transfer apparatus (not shown). In the state in which the boat 217 is lowered, the furnace opening shutter 116 closes the lower surface of the processing furnace 202 to prevent outside air from entering into the processing furnace 202.

The transfer motions of the cassette loader 114 and the like are controlled by transfer control means 124.

The entire disclosure of Japanese Patent Application No. 2004-70136 filed on Mar. 12, 2004 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

INDUSTRIAL APPLICABILITY

As explained above, according to the preferred embodiment of the present invention, there is proposed a substrate processing apparatus and a producing method of a semiconductor device both capable of preventing or restraining the reaction gas supply period and the rotation period of a substrate from being brought into synchronization with each other, thereby preventing the consistency of thickness of a film formed on the substrate over its entire surface from being deteriorated.

As a result, the present invention can especially preferably be utilized for a substrate processing apparatus and a producing method of a semiconductor device which process a semiconductor substrate, such as a semiconductor Si wafer, using gas.

The invention claimed is:

1. A substrate processing apparatus, comprising:
a processing chamber for processing a substrate;
a rotating mechanism for holding and rotating the substrate in the processing chamber;
a gas supply unit for supplying processing gas into the processing chamber;
at least one pair of electrodes disposed in the processing chamber for generating plasma to excite the processing gas supplied into the processing chamber by being applied with high frequency electric power; and
a controller that controls the rotating mechanism and the gas supply unit such that a supply cycle of the processing gas and a rotation period of the substrate do not come into synchronization with each other when the processing gas is periodically supplied into the processing chamber.

2. A substrate processing apparatus, comprising:
a processing chamber for processing a substrate;
a rotating mechanism for holding and rotating the substrate in the processing chamber;
a gas supply unit for supplying processing gas into the processing chamber;
an exhaust unit for exhausting atmosphere in the processing chamber; and
a controller that controls the rotating mechanism, the gas supply unit and the exhaust unit, wherein
the gas supply unit includes a gas supply path connected to the processing chamber and a gas supply valve for opening and closing the gas supply path,
the exhaust unit includes an exhaust path connected to the processing chamber and an exhaust valve for opening and closing the exhaust path,
the controller controls the gas supply unit and the exhaust unit such that when the processing gas is supplied into the processing chamber, the gas supply valve is opened to supply the processing gas into the processing chamber through the gas supply path in a state in which exhaust of the processing chamber is substantially stopped with the exhaust valve being closed, and the controller controls the rotating mechanism and the gas supply unit such that a supply cycle of the processing gas and a rotation period of the substrate do not come into synchronization with each other when the processing gas is periodically supplied into the processing chamber.

3. The substrate processing apparatus as recited in claim 2, wherein
the gas supply unit further includes a gas reservoir disposed upstream from the gas supply valve for storing the processing gas, and
the controller controls the gas supply unit such that after supplying the processing gas into the gas supply path and storing the processing gas in the gas reservoir with the gas supply valve being stopped, the gas supply valve is opened to supply the processing gas stored in the gas reservoir into the processing chamber.

4. A substrate processing apparatus, comprising:
a processing chamber for accommodating substrates arranged in a stacked manner;
a rotating mechanism for holding and rotating the substrates in the processing chamber;
a gas introducing section provided in the processing chamber along a stacking direction of the substrates for introducing processing gas;
a buffer chamber that includes a plurality of gas supply ports arranged along the stacking direction of the substrates and that is configured such that the processing gas introduced from the gas introducing section is supplied from the plurality of gas supply ports into the processing chamber; and
a controller that controls the rotating mechanism and the gas introducing section, wherein
the controller controls the rotating mechanism and the gas introducing section such that a supply cycle of the processing gas and a rotation period of the substrate do not come into synchronization with each other when the processing gas is periodically supplied into the processing chamber.

5. A producing method of a semiconductor device, comprising:
processing a substrate using a substrate processing apparatus including:
a processing chamber for processing the substrate;
a rotating mechanism for holding and rotating the substrate in the processing chamber;
a gas supply unit for supplying processing gas into the processing chamber; and
a controller that controls the rotating mechanism and the gas supply unit such that a supply cycle of the processing gas and a rotation period of the substrate do not come into synchronization with each other when the processing gas is periodically supplied into the processing chamber.

6. A producing method of a semiconductor device, comprising:
transferring a substrate into a processing chamber;
processing the substrate with the substrate being rotated in the processing chamber and processing gas being periodically supplied into the processing chamber; and
transferring the substrate out of the processing chamber, wherein in the processing of the substrate, a supply cycle of the processing gas and a rotation period of the substrate do not come into synchronization with each other.

7. A producing method of a semiconductor device, comprising:
processing a substrate using a substrate processing apparatus including:
a processing chamber for processing the substrate;
a rotating mechanism for holding and rotating the substrate in the processing chamber;
a gas supply unit for supplying processing gas into the processing chamber;
at least one pair of electrodes disposed in the processing chamber for generating plasma to excite the processing gas supplied into the processing chamber by being applied with high frequency electric power; and
a controller that controls the rotating mechanism and the gas supply unit such that a supply cycle of the processing gas and a rotation period of the substrate do not come into synchronization with each other when the processing gas is periodically supplied into the processing chamber.

8. A producing method of a semiconductor device, comprising:
processing a substrate using a substrate processing apparatus including:
a processing chamber for processing the substrate;
a rotating mechanism for holding and rotating the substrate in the processing chamber;
a gas supply unit for supplying processing gas into the processing chamber;
an exhaust unit for exhausting atmosphere in the processing chamber; and
a controller that controls the rotating mechanism, the gas supply unit and the exhaust unit, wherein
the gas supply unit includes a gas supply path connected to the processing chamber and a gas supply valve for opening and closing the gas supply path,
the exhaust unit includes an exhaust path connected to the processing chamber and an exhaust valve for opening and closing the exhaust path,
the controller controls the gas supply unit and the exhaust unit such that when the processing gas is supplied into the processing chamber, the gas supply valve is opened to supply the processing gas into the processing chamber through the gas supply path in a state in which exhaust of the processing chamber is substantially stopped with the exhaust valve being closed, and
the controller controls the rotating mechanism and the gas supply unit such that a supply cycle of the processing gas and a rotation period of the substrate do not come into synchronization with each other when the processing gas is periodically supplied into the processing chamber.

9. A producing method of a semiconductor device, comprising:
transferring a substrate into a processing chamber;
processing the substrate with the substrate being rotated in the processing chamber and processing gas being supplied into the processing chamber in a state in which exhaust of the processing chamber is substantially stopped; and
transferring the substrate out of the processing chamber, wherein when the processing of the substrate is carried out predetermined times, a supply cycle of the processing gas and a rotation period of the substrate do not come into synchronization with each other.

10. A producing method of a semiconductor device, comprising:
processing substrates using a substrate processing apparatus including:
a processing chamber for accommodating the substrates arranged in a stacked manner;
a rotating mechanism for holding and rotating the substrates in the processing chamber;

a gas introducing section provided in the processing chamber along a stacking direction of the substrates for introducing processing gas;

a buffer chamber that includes a plurality of gas supply ports arranged along the stacking direction of the substrates and that is configured such that the processing gas introduced from the gas introducing section is supplied from the plurality of gas supply ports into the processing chamber; and a controller that controls the rotating mechanism and the gas introducing section, wherein the controller controls the rotating mechanism and the gas introducing section such that a supply cycle of the processing gas and a rotation period of the substrate do not come into synchronization with each other when the processing gas is periodically supplied into the processing chamber.

11. A substrate processing apparatus, comprising:

a processing chamber for processing the substrate;

a rotating mechanism for holding and rotating the substrate in the processing chamber;

a gas supply unit for supplying processing gas into the processing chamber; and a controller that controls the rotating mechanism and the gas supply unit such that a supply cycle of the processing gas and a rotation period of the substrate do not come into synchronization with each other when the processing gas is periodically supplied into the processing chamber.

* * * * *